United States Patent [19]

Weber

[11] Patent Number: 5,459,799
[45] Date of Patent: Oct. 17, 1995

[54] TUNABLE OPTICAL FILTER

[75] Inventor: Jean-Pierre Weber, Stockholm, Sweden

[73] Assignee: Telefonaktiebolaget LM Ericsson, Stockholm, Sweden

[21] Appl. No.: 288,878

[22] Filed: Aug. 12, 1994

Related U.S. Application Data

[63] Continuation of Ser. No. 929,448, Aug. 14, 1992, abandoned.

[51] Int. Cl.⁶ ........................................................... G02B 6/10
[52] U.S. Cl. ........................ 385/2; 385/1; 385/8; 359/288
[58] Field of Search ................................ 385/1, 2, 8, 10, 385/37; 359/288

[56] References Cited

U.S. PATENT DOCUMENTS

| | | | |
|---|---|---|---|
| 4,278,327 | 7/1981 | McMahon et al. | 385/2 |
| 4,826,282 | 5/1989 | Alferness . | |
| 4,837,526 | 6/1989 | Suzuki et al. | 385/8 |
| 4,885,753 | 12/1989 | Okai et al. . | |
| 4,923,264 | 5/1990 | Langer et al. | 385/2 |
| 5,035,479 | 7/1991 | Vounckx | 385/8 |
| 5,048,907 | 9/1991 | Wickman et al. | 385/2 |
| 5,073,809 | 12/1991 | Bigan et al. | 385/8 |
| 5,155,736 | 10/1992 | Ono et al. | 385/2 |

FOREIGN PATENT DOCUMENTS

| | | |
|---|---|---|
| 219069 | 8/1987 | European Pat. Off. . |
| 496348 | 7/1992 | European Pat. Off. . |
| 2170322 | 7/1986 | United Kingdom . |
| 2239100 | 6/1991 | United Kingdom . |

OTHER PUBLICATIONS

Patent Abstracts of Japan, JP 1–186918 (Jul. 26, 1989).
Patent Abstracts of Japan, JP 61–255085 (Nov. 12, 1986).
Patent Abstracts of Japan, JP 2–062501 (Mar. 2, 1990).
L. G. Kazovsky et al., "DBR Active Optical Filters: Transfer Function and Noise Characteristics" *Journal of Lightwave Technology*, vol. 8, No. 10, pp. 1441–1451 (Oct. 1990).
P. Granestrand et al., "Integrated Optics 4×4 Switch Matrix With Digital Optical Switches" *Electronics Letters*, vol. 26, pp. 4–5 (Jan. 4, 1990).
H. Heidrich et al, "Passive Mode Converter with a Periodically Tilted InP/GaInAsP Rib Waveguide", *IEEE Photonics Technology Letters*, vol. 4, pp. 34–36 (Jan. 1992).
Y. Inoue et al., "Polarization Sensitivity of a Silica Waveguide Termooptic Phase Shifter for Planar Lightwave Circuits", *IEEE Photonics Technology Letters*, vol. 4, pp. 36–38 (Jan. 1992).
T. Koch et al., "Semiconductor Lasers for Coherent Optical Fiber Communications", *Journal of Lightwave Technology*, vol. 8, pp. 274–293 (Mar. 1990).
T. Numai, "Semiconductor Wavelength Tunable Optical Filters", *International Journal of Optoelectronics*, voo. 6, pp. 239–252 (1991).
K. Oda et al, "A 16–Channel Frequency Selection Switch for Optical FDM Distribution Systems", *IEEE Journal on Selected Areas in Communications*, vol. 8, pp. 1132–1140 (Aug. 1990).
O. Sahlen et al., "Two–Channel Optical Filtering of 1 Gbit/s Signal With DBR Filter", *Electronics Letters*, vol. 27, pp. 578–579 (Mar. 28, 1991).
M. Schilling et al., "Integrated Interferometric Injection Laser: Novel Fast and Broad–Band Tunable Monolithic Light Source", *IEEE Journal of Quantum Electronics*, vol. 27, pp. 1616–1624 (Jun. 1991).

(List continued on next page.)

*Primary Examiner*—John T. Kwon
*Attorney, Agent, or Firm*—Burns, Doane, Swecker & Mathis

[57] ABSTRACT

A tunable optical filter for use in wavelength division multiplexing systems. The optical filter contains a plurality of tunable reflection gratings which block all of the channels in the incoming lightwave. An electrode or a heating element is provided for each reflection grating to tune the reflection gratings so that their reflection bands do not coincide with a desired channel or channels thereby allowing the desired channel or channels to pass through the filter.

24 Claims, 3 Drawing Sheets

OTHER PUBLICATIONS

H. Takahashi et al., "Polarization–Insensitive Arrayed–Waveguide Grating Wavelength Multiplexer on Silicon", *Optics Letters,* vol. 17, pp. 499–501 (Apr. 1, 1992).

N. Takato et al., "Silica–Based Integrated Optic Mach–Zehnder Multi–Demultiplexer Family with Channel Spacing of 0.01–250 nm", *IEEE Journal on Selected Areas in Communications,* vol. 8, pp. 1120–1127 (Aug. 1990).

H. Yanagawa et al., "Polarization– and Wavelength–Insensitive Guided–Wave Optical Switch with Semiconductor Y Junction", *Journal of Lightwave Technology,* vol. 8, pp. 192–197 (Aug. 1990).

TUNABLE OPTICAL FILTER

This application is a divisional of application Ser. No. 07/929,448, filed Aug. 14, 1992, now abandoned.

FIELD OF THE INVENTION

The invention relates to an optical filter device, and more particularly to a tunable optical filter device in which a predetermined wavelength or wavelengths of an optical signal are selected from wavelength division multiplexed optical signals.

BACKGROUND OF THE INVENTION

Densely packed incoherent wavelength division multiplex (WDM) lightwave communication systems are attractive over coherent (heterodyne) communication systems because the incoherent system uses the large wavelength (frequency) domain available in an optical fiber by assigning different wavelengths to different channels in the communication system. A key component in an incoherent WDM lightwave communication system is the lightwave receiver which provides filtering, amplification, and detection of the lightwave signals. If direct detection is used instead of coherent detection, tunable optical filters will be needed to separate the different multiplexed wavelengths (channels) both for routing and final detection purposes. A WDM receiver using direct optical detection must optically filter the multi-frequency WDM signal to pass only the desired channel or channels to the direct optical detector. A tunable optical filter therefore has the function of selecting a predetermined wavelength light signal from the plurality of multiplexed lightwave signals. Thus, the goal of a tunable optical filter is to select one channel (or several channels) in a given incoming wavelength multiplexed optical signal and block the other channels from passing through the filter.

Several different optical filters have been developed. Fabry-Perot filters with mechanical tuning, i.e., a piezoelectric element, have been developed. However, the use of mechanically operated filters has several disadvantages. First, optical filters with moving components are typically bulky and are expensive to produce. In addition, optical filters with moving components have poor reliability and lower switching speeds than electronically controlled optical filters.

Optical filters based on acousto-optic TE/TM mode conversion and waveguides have also been developed. However, these filters require a relatively complex drive circuit to generate the required acoustic waves. In addition, the filters are relatively large with a length on the order of one to two centimeters. Optical filters based on semiconductor distributed feedback (DFB) laser diodes and multi-section Fabry-Perot laser diodes have also been developed. Such distributed feedback semiconductor laser structures are operated with a bias current set below a threshold current for lasing. While these devices have the advantage of having gain, they also have several disadvantages. First, the tuning range of these distributed feedback semiconductor laser devices is small at less than two nanometers at a wavelength of 1.5 micrometers for a InGaAsP/InP device. Furthermore, they have a very narrow bandwidth because of the gain and they are susceptible to saturation effects if the incoming signal power is too high.

Optical filters based upon a distributed-Bragg reflection (DBR) laser structure have also been developed. The distributed-Bragg reflection laser structure is employed as an integrated receiver within a lightwave communication system. The DBR laser structure is biased electrically below the lasing threshold to operate as a multifunctional element by performing the integrated operation of resonant amplification and filtering of the received lightwave signals. By electrically biasing the Bragg section of the DBR laser structure, it is possible to tune the filter so as to select the desired wavelength. The DBR laser structure has a larger tuning range, up to 15 nanometers, than the DFB laser diodes, and it can be made insensitive to the power of the input signal by removing the gain section from the filter. However, the DBR laser structure operates using reflection wherein the output signal is reflected back in the input waveguide, through the input signal, which results in loss penalties when the signals are separated.

SUMMARY OF THE DISCLOSURE

The present invention discloses a tunable optical filter for use in a wavelength division multiplexing system. The optical filter contains a plurality of tunable reflection gratings which block all of the channels in the incoming lightwave. The gratings can be tuned so that their reflection bands do not coincide with a desired channel or channels thereby allowing the desired channel or channels to pass through the filter.

In one embodiment of the present invention, the tunable optical filter has a first semiconductor substrate which has an electrode on one surface. A waveguide is formed in and laterally defined within the surface of the substrate for carrying lightwaves. A plurality of tunable reflection grating are provided on a second surface of the semiconductor on top of the waveguide. An insulating substrate is provided on both sides of the waveguide. A plurality of electrodes control the tunable reflection gratings so as to vary the effective index of refraction of a section of the waveguide below each grating.

BRIEF DESCRIPTION OF THE DRAWINGS

These and other features and advantages of the present invention will be readily apparent to one of ordinary skill in the art from the following written description read in conjunction with the drawings, in which.

DETAILED DESCRIPTION OF THE PREFERRED EMBODIMENTS

Figure 1:
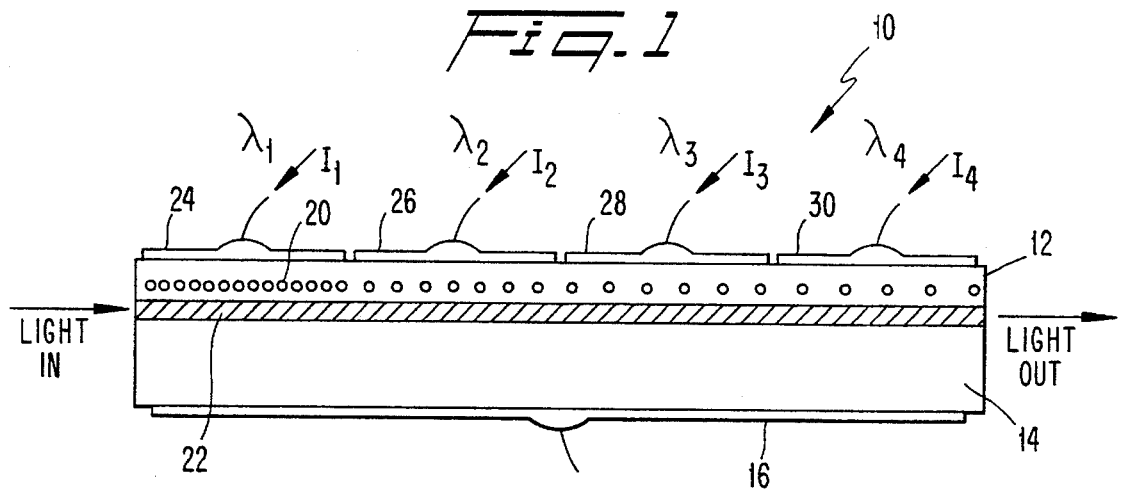
FIG. 1 is a cross-sectional view of an optical filter of one embodiment of the present invention.
Figure 2:
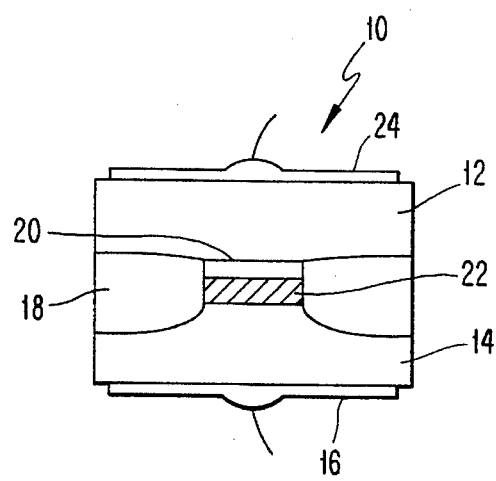
FIG. 2 is a transverse cross-sectional view of the optical filter illustrated in FIG. 1.

In FIG. 1, there is shown a tunable optical filter 10 of one embodiment of the present invention. FIG. 1 illustrates an example of the optical filter for a four-channel system. The figure is only for illustration and one of ordinary skill in the art would understand that the invention is not limited thereto. In this embodiment, the tunable optical filter is constructed out of InGaAsP/InP semiconductor material. The layer structure of the tunable optical filter comprises a substrate 14 of n-InP material and a layer 12 of p-InP material. A waveguide 22 is formed between layer 12 and the substrate 14 and is formed out of an intrinsic material. A diffraction grating layer 20 is formed in between the waveguide 22 and the layer 12. In this embodiment, the waveguide is divided into four sections since this is a four-channel system. In each section, the period of the reflection grating is different. Electrical insulation, which is not shown in FIG. 1, is needed in between the different grating sections. The electrical insulation can be formed by ion implantation or by replacing the n-InP layer 12 with a semi-insulating (Fe doped) InP material between the grating sections. In order to control the refractive index in the four sections of the waveguide, four electrodes 24, 26, 28 and 30 are formed on top of layer 12. In addition, another electrode 16 is formed on the bottom of substrate 14. Finally, as illustrated in FIG. 2, a semi-insulating InP layer is formed on either side of the waveguide 22 in order to separate layer 12 from substrate 14. The optical waveguide 22 is constructed out of a InGaAsP core which has a bandgap with a shorter wavelength than the light passing through in order to avoid absorption. The waveguide 22 is surrounded by InP material so that it forms a buried hetero structure. The Bragg diffraction gratings are formed in the layer 20, using InGaAsP and InP material. This can be done by one of the well-known methods used in DFB lasers, such as direct electron-beam writing, etching, and regrowth.

Since the waveguide 22 is constructed out of an intrinsic core material and the two substrates 12 and 14 are constructed out of p-InP material and n-InP material respectively, the resulting structure forms a P-I-N diode structure which allows injection of electrons and holes into the intrinsic waveguide 22. The semi-insulating InP layer 18 is used on the sides of the waveguide 20 in order to confine the current to the intrinsic waveguide. The injected carriers will change the refractive index of the waveguide and thereby allow the tuning of the wavelength of the reflection band of the corresponding grating. To allow independent tuning of the four grating sections, there are four electrical contacts on top of the p-InP layer.

Typical dimensions for the device described above would be as follows. The waveguide 22 would have a thickness between 0.2 and 0.6 micrometers with a width of approximately 1 micrometer. The layer 12 would have a thickness between 1 and 3 micrometers with a length for each grating section between 200 and 500 micrometers. The electrical insulation between the grating sections would be between 10 and 50 micrometers. Therefore, the total length for a four channel example would be between 1 and 2 millimeters.

In accordance with the above-described structure of the tunable wavelength filter, the principle in which a transmission wavelength is controlled will be explained as follows.

Figure 3:
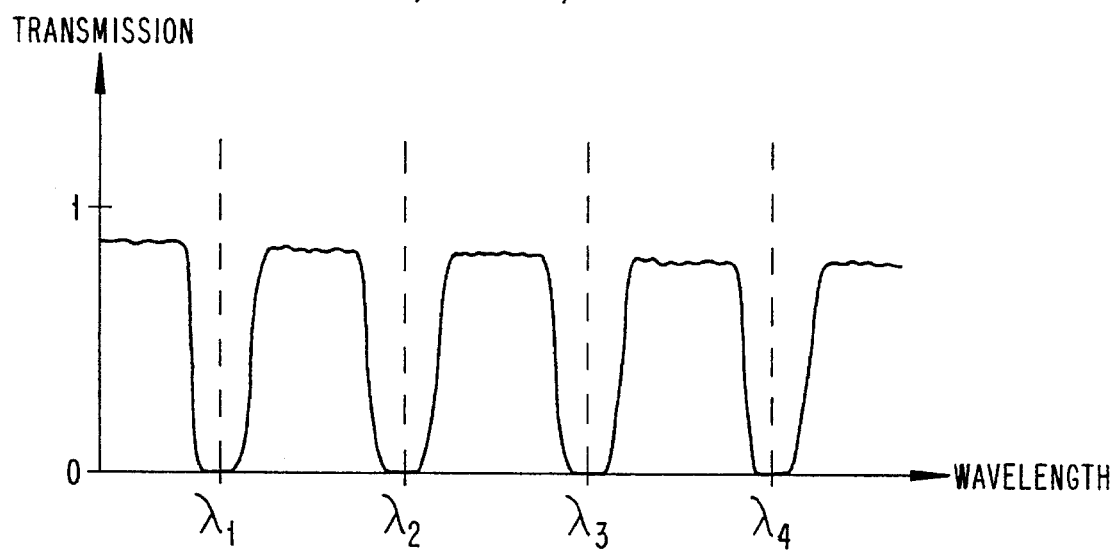
FIG. 3 is an explanatory diagram showing the transmission spectrum of the light that passes through the filter when no current is applied to the device.
Figure 4:
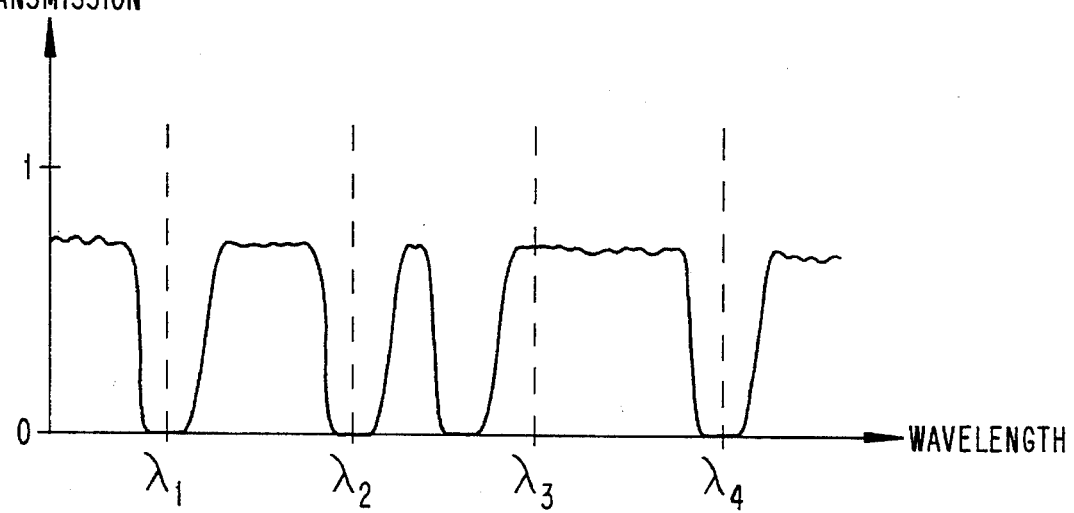
FIG. 4 is an explanatory diagram showing a wavelength shift to allow a channel through the filter.

In FIG. 3, the transmission of light through the filter is illustrated as a function of the wavelength of the light. Bragg diffraction gratings with different periods block light of different wavelengths from passing through that portion of the filter. As a result, by selecting four different periods for the diffraction gratings, four different wavelength bands of the light entering into a filter will not be allowed to pass through the filter as illustrated in FIG. 3. By selecting the channels of a communication system, i.e., $\lambda_1$, $\lambda_2$, $\lambda_3$, $\lambda_4$, to coincide with the wavelengths which are not allowed to be transmitted through the filter, the optical filter can control the wavelength signals which pass through the filter. In the present embodiment, the gratings are designed so as to block the channels when no current is applied to electrodes 24, 26, 28 and 30. As illustrated in FIG. 4, when a current is supplied, for example, to electrode 28, the effective index of refraction of the waveguide section below the section which had been blocking the third channel is changed so that the wavelength corresponding to the third channel is no longer blocked and is allowed to pass through the filter. As a result, any channel can be selected by supplying the appropriate voltage to the appropriate electrode which changes the index of refraction inside the waveguide.

The grating tuning is based upon a change of the effective index of refraction. This change can be achieved in several ways. First, free carrier injection in the waveguide can be used. The free carrier injection method uses forward bias in a P-I-N diode structure to inject carriers into the waveguide. This method is used in tunable DBR lasers as disclosed in "Semiconductor Lasers for Coherent Optical Fiber Communications", T. Koch and U. Koren, Journal of Lightwave Technology, Vol. 8 (3), March 1990, pp. 274–293. Free carrier depletion in a waveguide can also be used to change the effective index of refraction. In that case, the InGaAsP material used for the waveguide 22 should be doped. The free carrier depletion method uses a reverse bias to sweep the carriers out of the waveguide thereby changing the effective index of refraction. The effective index of refraction can also be changed using electro-optic tuning. In electro-optic tuning, an electric field applied through a reverse biased P-I-N structure changes the refractive index of the waveguide. This can be done with bulk material, but quantum wells should probably be used in order to get a sufficient index change. The above-listed methods of creating tuning are not meant to be exclusive since other methods are also possible. For example, if the filter were made out of dielectric material, such as $SiO_2$ on a Si substrate as described below, the whole P-I-N diode structure could be replaced by a simple heating resistance in contact with the waveguide to change the effective index of refraction by thermo-optic effect.

Figure 5:
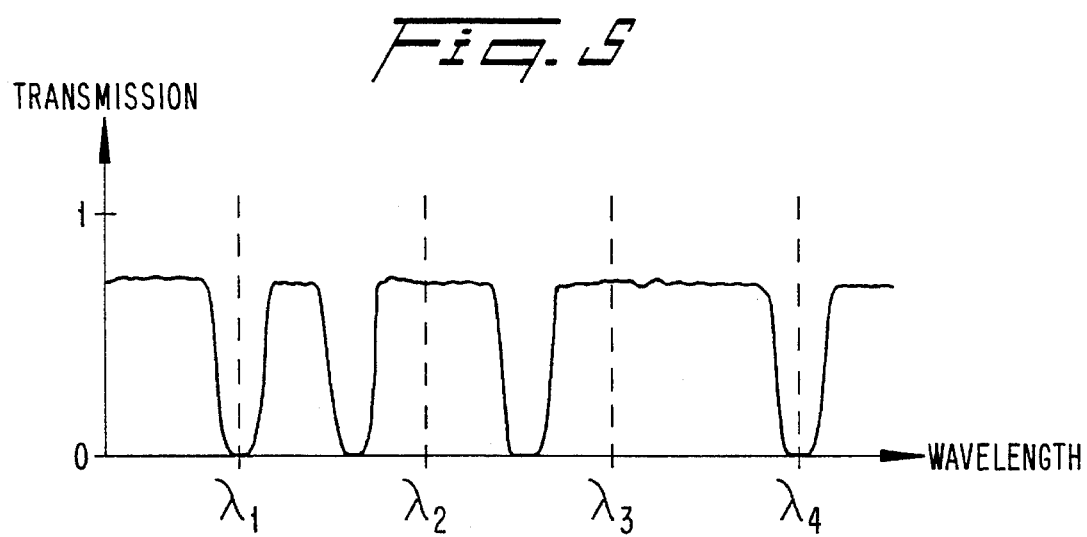
FIG. 5 is an explanatory diagram showing a wavelength shift to allow several channels through the filter.

In the present embodiment a reflection grating is provided for each channel in the communication system. The gratings are designed to block each channel when no current is applied through electrodes 24, 26, 28 and 30. Since precise fabrication of each grating can be difficult, i.e., small errors in the wavelength positioning of the gratings may occur so that a grating does not block a channel which it is supposed to block, the filter can be compensated by tuning the grating through one of the methods disclosed above. Furthermore, if channel spacing is large enough so that when one channel is opened the shifted reflection band does not block a neighboring channel, the filter may allow several channels to pass through instead of just one. This is illustrated in FIG. 5, which shows that the gratings corresponding to channels 2 and 3 have been tuned to let theses channels through the filter while channels 1 and 4 remain blocked. This can be advantageous when the filter device is used in a system to perform wavelength dependent routing.

Figure 6:
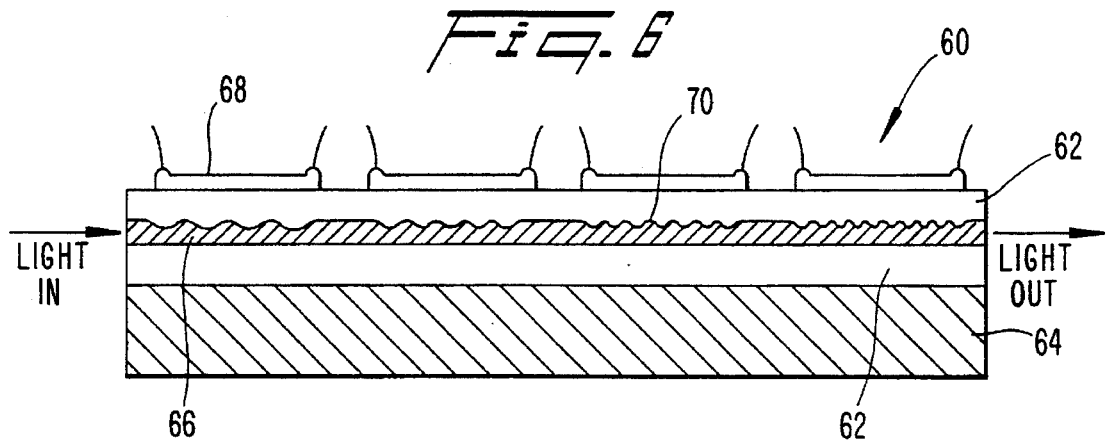
FIG. 6 is a cross-sectional view of an optical filter of another embodiment of the present invention.
Figure 7:
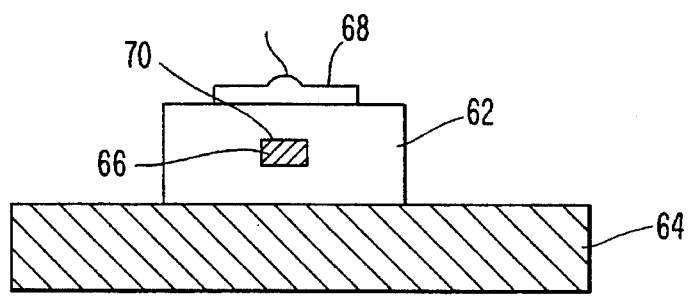
FIG. 7 is a transverse cross-sectional view of the optical filter illustrated in FIG. 6.

Another embodiment of the present invention is illustrated in FIGS. 6 and 7. The figures are for illustration only and illustrate a four-channel filter 60 which is constructed out of dielectric material. In this embodiment, a silica-based waveguide with a $SiO_2$—$GeO_2$ core 66 is buried in a $SiO_2$ cladding 62 on a Si substrate 64. Tunable reflection gratings 70 are formed on the top surface of the core 66 by etching the top surface of the core 66 before regrowing the $SiO_2$ cladding 62 on top of the core 66. In this embodiment, the waveguide is divided into 5 sections since this is a four channel system. In each section, the period of the reflection grating is different. The reflection gratings 70 are tuned by thermo-optic effect, wherein the effective index of refraction of the waveguide section below the gratings is changed by a temperature change. A heating resistance is deposited on top of the waveguide section below each reflection grating so that the effective index of refraction for each reflection grating can be independently controlled. It will be understood by one of ordinary skill in the art that other dielectric materials, such as $Si_3N_4$, can also be used. Due to the thermal tuning, this embodiment will probably have a longer switching time and a larger size than the InGaAsP/InP implementation. However, a dielectric filter with thermo-optic tuning may still be used in some applications due to lower fabrication costs.

In another embodiment of the present invention, a large number of gratings with partially overlapping reflection bands and a corresponding number of electrodes are used in the optical filter instead of having one grating for each channel. The gratings are designed so as to completely block a wavelength band larger than the input wavelength band. By designing the gratings to completely block a wavelength band larger than the band used, the filter has some tolerance to imperfections in the fabrication of the filter. The electrodes can then be used to change the effective refractive index of the waveguide sections to allow one or several channels to pass through the filter. This configuration has several advantages. First, the gratings block the spontaneous emission noise outside the channels that are caused by the amplifiers in the system. As a result, a quieter signal is outputted from the filter. In addition, the filter can be reconfigured electrically if the channel configuration of the system changes.

Material and composition of the filter of the present invention, may be replaced by other semiconductor materials such as, for instance, AlGaAs/GaAs system material or dielectric material such as for instance, $TiO_2$, $Al_2O_3$, etc. Furthermore, the optical waveguide structure is not limited to planar structure or buried structure.

It will be appreciated by those of ordinary skill in the art that the present invention can be embodied in other specific forms without departing from the spirit or essential character thereof. The presently disclosed embodiments are therefore considered in all respects to be illustrative and not restrictive. The scope of the invention is indicated by the appended claims, rather than the foregoing description and all changes which come within the meaning and range of equivalents thereof are intended to be embraced therein.

What is claimed is:

1. A tunable optical filter, comprising:

a first semiconductor substrate having a first electrode means provided on a first surface thereof;

a waveguide means formed in and laterally defined within the surface of said substrate for carrying light waves;

a plurality of tunable reflection grating means provided on a second surface of said semiconductor substrate on top of said waveguide, wherein said reflection grating blocks incoming lightwaves when said grating is untuned;

an insulating substrate means provided on both sides of said waveguide; and a plurality of electrode means, wherein each of said tunable reflection gratings has an electrode for varying an effective index of refraction of a section of said waveguide below said grating.

2. A tunable optical filter according to claim 1, wherein each tunable reflection grating has a different period.

3. A tunable optical filter according to claim 1, wherein each channel of the incoming lightwave is blocked by one of the tunable reflection gratings.

4. A tunable optical filter according to claim 1, wherein said effective index of refraction is changed by free carrier injection in the waveguide.

5. A tunable optical filter according to claim 1, wherein said effective index of refraction is changed by free carrier depletion in the waveguide.

6. A tunable optical filter according to claim 1, wherein said effective index of refraction is changed by electro-optic tuning.

7. A tunable optical filter according to claim 1, wherein said gratings are such that all channels are blocked when no current is supplied to the corresponding electrode.

8. A tunable optical filter according to claim 1, wherein said effective index of refraction is changed by thermo-optic tuning.

9. A tunable optical filter according to claim 1, wherein said plurality of tunable reflection gratings block the entire wavelength range of an input signal.

10. A tunable optical filter according to claim 1, wherein said plurality of tunable reflection gratings have partially overlapping reflection bands to block the entire wavelength range of an input signal.

11. A tunable optical filter according to claim 1, wherein the reflection gratings block a plurality of channels from passing through said filter.

12. A tunable optical filter for a communication system with a plurality of channels, comprising:

a first semiconductor substrate having a first electrode means provided on a first surface thereof;

a waveguide means formed in and laterally defined within the surface of said substrate for carrying light waves;

a plurality of tunable reflection gratings means provided on a second surface of said semiconductor substrate on top of said waveguide, wherein each of said tunable reflection gratings blocks a particular channel of the communication system;

an insulating substrate means provided on both sides of said waveguides; and a plurality of electrode means for varying the effective index of refraction of a section of said waveguide below said grating.

13. A tunable optical filter according to claim 12, wherein said effective index of refraction is changed by free carrier injection in the waveguide.

14. A tunable optical filter according to claim 12, wherein said effective index of refraction is changed by free carrier depletion in the waveguide.

15. A tunable optical filter according to claim 12, wherein said effective index of refraction is changed by electro-optic tuning.

16. A tunable optical filter according to claim 12, wherein said gratings block all channels when current is not supplied to said electrodes.

17. A tunable optical filter according to claim 12, wherein said effective index of refraction is changed by thermo-optic tuning.

18. A tunable optical filter, comprising:

a substrate;

a dielectric cladding layer provided on top of said substrate;

a waveguide means formed in and laterally defined within the surface of said cladding layer;

a plurality of tunable reflection grating means provided on top of said waveguide, wherein said reflection grating blocks incoming lightwaves when said grating is untuned; and a plurality of heating elements on top of said cladding layer, wherein each of said tunable reflection gratings has a heating element for varying an effective index of refraction of a section of said waveguide below said grating.

19. A tunable optical filter according to claim 18, wherein each tunable reflection grating has a different period.

20. A tunable optical filter according to claim 18, wherein each channel of the incoming lightwave is blocked by one of the tunable reflection gratings.

21. A tunable optical filter according to claim 18, wherein said effective index of refraction is changed by thermo-optic tuning.

22. A tunable optical filter according to claim 18, wherein said plurality of tunable reflection gratings block the entire wavelength range of an input signal.

23. A tunable optical filter according to claim 18, wherein said plurality of tunable reflection gratings have partially overlapping reflection bands to block the entire wavelength range of an input signal.

24. A tunable optical filter according to claim 18, wherein the reflection gratings block a plurality of channels from passing through said filter.

* * * * *